United States Patent
Van Camp et al.

(10) Patent No.: US 7,110,230 B2
(45) Date of Patent: Sep. 19, 2006

(54) METHOD AND APPARATUS FOR PROVIDING CURRENT CONTROLLED ELECTROSTATIC DISCHARGE PROTECTION

(75) Inventors: Benjamin Van Camp, Bruges (BE); Frederic De Ranter, Aalter (BE); Geert Wybo, Ghent (BE); Bart Keppens, Gistel (BE)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 11/147,668

(22) Filed: Jun. 8, 2005

(65) Prior Publication Data

US 2005/0286188 A1    Dec. 29, 2005

Related U.S. Application Data

(60) Provisional application No. 60/577,785, filed on Jun. 8, 2004.

(51) Int. Cl.
*H02H 3/22* (2006.01)
*H02H 9/00* (2006.01)

(52) U.S. Cl. .................................... 361/56; 361/111
(58) Field of Classification Search ................ 361/56, 361/111, 57
See application file for complete search history.

(56) References Cited

U.S. PATENT DOCUMENTS

| | | | | |
|---|---|---|---|---|
| 5,682,047 | A  * | 10/1997 | Consiglio et al. | 257/335 |
| 5,946,177 | A  * |  8/1999 | Miller et al. | 361/56 |
| 6,724,603 | B1 * |  4/2004 | Miller et al. | 361/111 |
| 6,786,616 | B1 * |  9/2004 | Parsons | 362/116 |
| 2004/0188776 | A1 * |  9/2004 | Russ et al. | 257/401 |

* cited by examiner

*Primary Examiner*—Brian Sircus
*Assistant Examiner*—Zeev Kitov
(74) *Attorney, Agent, or Firm*—Lowenstein Sandler

(57) ABSTRACT

A method and apparatus for providing ESD protection. An ESD clamp is connected across the terminals to be protected circuit. The clamp is coupled to a current detector that activates the clamp when current from an ESD event exceeds a predefined limit.

25 Claims, 6 Drawing Sheets

US 7,110,230 B2

METHOD AND APPARATUS FOR PROVIDING CURRENT CONTROLLED ELECTROSTATIC DISCHARGE PROTECTION

CROSS-REFERENCE TO RELATED APPLICATIONS

This application claims benefit of U.S. provisional patent application Ser. No. 60/577,785, filed Jun. 8, 2004, which is herein incorporated by reference.

BACKGROUND OF THE INVENTION

Typically, an Integrated Circuit (IC) consists of a number of supply pins (power and ground), a number of input signal pins and some output pins. All of those pins (also referred to herein as pads) need safe electrostatic discharge (ESD) protection paths to all the other pins of the integrated circuit. In the IC industry, many different protection concepts exist, which include heterogeneous types of ESD protection for different pin types on a single IC. Various approaches have been utilized to provide ESD protection for the output pins of an IC, each with particular advantages and disadvantages. An output driver is typically created by an inverter-type of circuit. ESD protection of output drivers is extremely difficult. Many techniques exist all with drawbacks and disadvantages, such as time delay, and silicon consuming trigger voltage tuning, area, complexity, speed reduction, among other notable deficiencies.

FIG. 1 is a schematic diagram of a conventional CMOS output driver 100 consisting of an inverter stage 102 comprising a first transistor 104 and a second transistor 106. Depending on the logic state of the input node 108 (driven by the core circuit 110), the output potential is pulled either high to Vdd (PMOS conduction) or low to Vss (NMOS conduction). In particular, the inverter circuit 102 comprises at least one PMOS transistor 104 and at least one NMOS transistor 106 coupled together (i.e., formed in a stack), illustratively between a first voltage line, Vdd, and a second voltage line, Vss. The internal core circuit 110 of the integrated circuit manipulates an input node 108 (gate connection of the NMOS and PMOS transistors 104, 106) of the inverter 102 to communicate with other chips or logic at the outside of the integrated circuit. For a logic low signal voltage at the input node, the NMOS transistor 106 will be switched off, while the PMOS transistor 104 will conduct and bring the output node close to the Vdd potential. In an instance where a logical high is present at the input node 108, the NMOS transistor 106 will conduct, thereby pulling the output node low, while the PMOS transistor 104 is switched off.

When positive ESD stress is applied at an unprotected output pad 112 versus the Vss line or ground, the NMOS transistor 106 will first conduct a small amount of current in MOS mode, due to an uncontrolled or floating NMOS gate. If no special 'keep-off' circuitry is behind the NMOS gate, such as described in commonly assigned U.S. Pat. No. 6,529,359, the contents of which is incorporated herein by reference, the gate is typically pulled high due to the parasitic gate-drain capacitance. This parasitic or dynamic gate-biasing reduces the snapback trigger voltage Vt1 to a Vt1', as shown in FIG. 2. This will create a MOS channel in the NMOS transistor 106 which reduces the Vt1 trigger voltage. Consequently, the NMOS transistor 106 will more easily trigger into a (parasitic) bipolar mode. A low gate bias is enough to reduce the Vt1 trigger voltage to the holding voltage of the parasitic NPN device.

One approach to providing ESD protection is to prevent snapback in the NMOS transistor 106 in the output driver 100. One conventional protection concept shown as circuit 300 in FIG. 3 consists of 'dual diode' protection of the output node, connecting a diode 304 between the Vss or ground node and the output node (diode down) and connecting a diode 302 between the output node and the Vdd node (diode up). These diodes 302/304 redirect ESD current to the supply lines/busses. A power clamp 306 between the Vdd and Vss lines clamps the voltage between the supply lines and dissipates the ESD current.

FIG. 3 depicts a schematic diagram of a dual diode and power clamp protection circuit 300 for ESD protection of the output driver 102. Two competitive trigger paths exist for the positive stress between the output pad and Vss. The intended current path flows through the diode 302 from output to Vdd and the power clamp 306 to the grounded Vss node. Due to a floating gate of the NMOS transistor 106, the transistor triggers into snapback at a reduced trigger voltage Vt1~Vh. In many high voltage technologies, this causes damage to the NMOS transistor. However, in many other technologies, such as, but not limited to, advanced silicided technologies, triggering into snapback can be dangerous as well. If the NMOS transistor is not ballasted to ensure uniform conduction through the entire NMOS, damage may result. In all cases, it will lead to a failure if the NMOS is not robust enough to shunt large ESD currents.

Furthermore, the total voltage drop in the intended current path can become very high due to a large bus resistance (large distance to a power clamp), a resistive diode (typical for high voltage technologies) or a high resistive power clamp. When this total voltage drop in the intended current path is too high, the current path through the NMOS transistor 106 can trigger, stressing the NMOS transistor 106 into a bipolar mode. When the NMOS transistor 106 is not designed for bipolar conduction, this leads to destruction of the NMOS transistor. Due to the reduced trigger voltage of the NMOS (Vt1'<Vt1, see above and FIG. 2), the maximum or critical voltage for the intended current path can be relatively small in advanced CMOS technologies.

Special techniques exist to increase the Vt1 trigger voltage of the NMOS transistor by pulling the NMOS gate to Vss during ESD stress. Such 'keep-off circuits' have been described before (U.S. Pat. No. 6,529,359) and can be used to protect the NMOS transistor. However, those circuits increase the complexity of the pre-driver logic and only increase the critical voltage a small amount (typically 1–2V in advanced CMOS technologies: $V_{delta} = V_{avalanche} - V_{hold}$). NMOS destruction can still occur for larger ESD stress currents.

The isolation resistor 308 'Riso' (see FIG. 3) that is sometimes placed between the output pad 112 and the output driver 102 can reduce the current through the NMOS transistor 106. If a small part of the ESD current flows through the NMOS transistor 106 and the resistor 308, a large voltage drop is induced that favors the intended current path through the diode 302 and the power clamp 306. This isolation resistor 308 has been used in mature technologies as a "quick" ESD fix, but it has many drawbacks. A large resistance value (~50 Ohm to 1 kOhm) is needed to effectively reduce the current through the NMOS transistor 106 to safe values. The output driver speed and output current/voltage is reduced as a function of the resistance value. Thus, the output driver size needs to be increased to maintain the normal operation output current level constant. Such an increase in size may not be practical.

Because the bus resistance typically increases the total voltage drop to excessive values, another method exists which locally protects the NMOS transistor 106. A local clamp 318/320 is placed near and parallel to the drain-source of the NMOS. The intention is to clamp the voltage to a safe value below the (reduced) Vt1 (Vt1') trigger voltage of the NMOS transistor 106. This requires a cumbersome trigger voltage selection for the local clamp 318/320 due to a very narrow ESD design window. The clamp needs to start conduction at a voltage well below the Vt1/Vt1' trigger voltage (which defines the maximum trigger voltage) of the NMOS transistor, but well above the normal operation maximum signal voltage to prevent unwanted triggering (which defines the minimum trigger voltage). In many applications, the difference between the maximum and minimum voltage is very small and sometimes negative. As such, in many instances, use of a local clamp 318/320 is not useful in protecting the transistors of any output driver inverter 102.

Presently, available techniques for protecting an output driver from ESD events are complex and interfere with the normal operation of the output driver. Therefore, there is a need in the art for a method and apparatus to improve the protection of the transistors used in output drivers.

SUMMARY OF THE INVENTION

The present invention is a method and apparatus for providing current controlled ESD protection for a circuit. The embodiments of the invention may be used to protect either input or output pads from ESD events. The ESD protection circuit comprises an ESD clamp and a current detector that controls activation of the clamp. The ESD clamp is connected across the output or input terminals of a driver transistor. The local clamp is coupled to a current detector that activates the clamp when current from an ESD event exceeds a predefined limit. The clamp may be used to protect both NMOS and PMOS transistors that are used in integrated circuits. The current detector and ESD clamp can be separately designed and might also be placed in separate areas of the semiconductor chip.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a current controlled ESD clamp to protect an NMOS or PMOS transistor in an integrated circuit against ESD stress applied between a node (input or output) and the Vss or Vdd node (or ground). To prevent trigger competition between the transistor and the ESD clamp, the trigger voltage for the clamp is controlled by the current flowing through the transistor. The invention comprises at least one current detector coupled to at least one ESD clamp. The current detector is designed to differentiate between current produced during normal integrated circuit operation and current generated during an ESD event.

Figure 1:
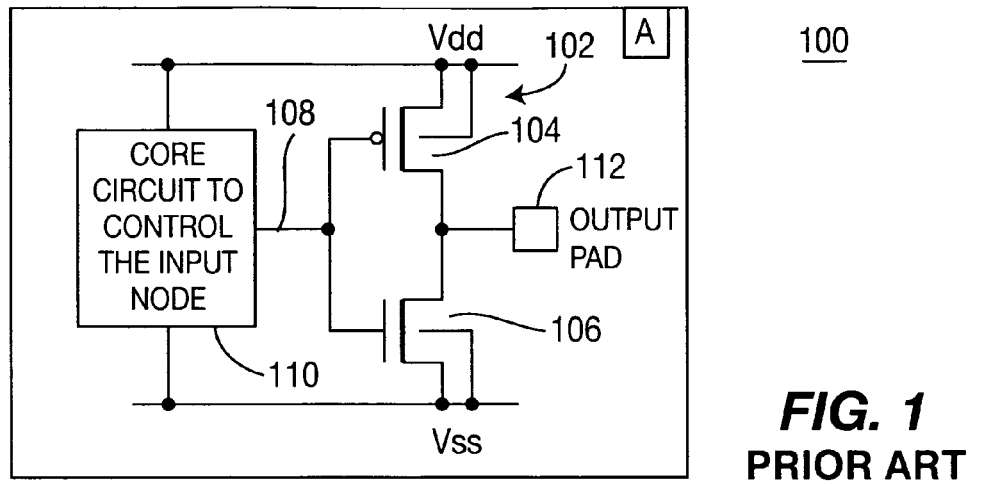
FIG. 1 is a schematic diagram of a conventional CMOS output driver configuration consisting of a inverter stage.
Figure 2:
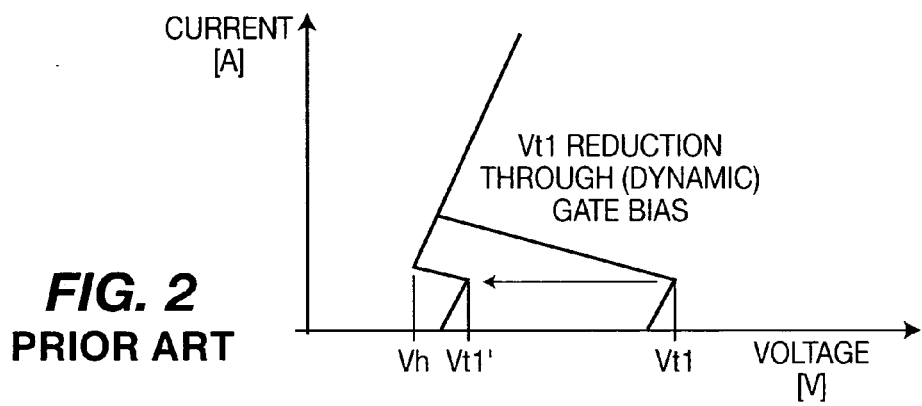
FIG. 2 graphically illustrates the effects of a positive ESD stress applied at the output pad versus the Vss on ground.
Figure 3:
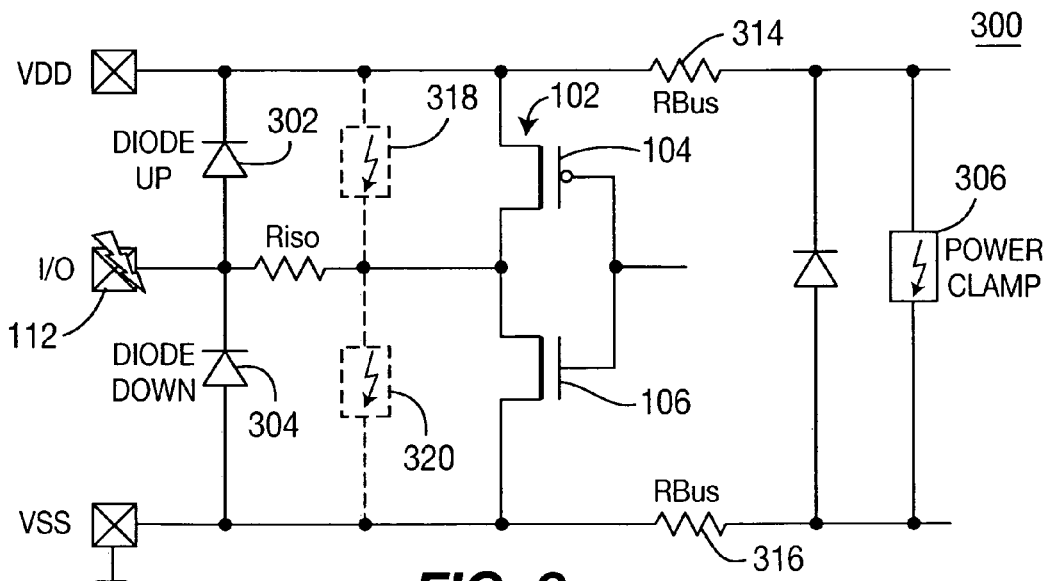
FIG. 3 is a schematic diagram of a conventional dual diode and power clamp protection circuit for ESD protection of the output driver.
Figure 4:
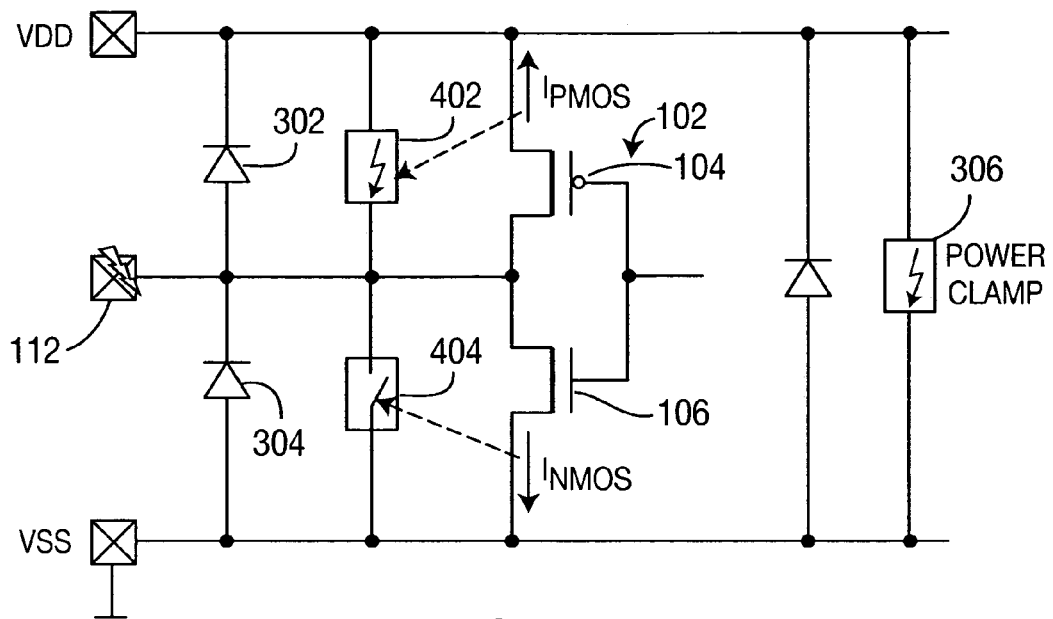
FIG. 4 is a schematic diagram of a current controlled ESD clamp of the present invention.

FIG. 4 is a schematic diagram of a first embodiment of an output driver 400 comprising current controlled ESD clamps 402/404 arranged to protect the transistors 104, 106 in the inverter 102. Specifically, a first ESD clamp 402 is connected from the source to drain terminals of a PMOS transistor 104 and a second ESD clamp 404 is connected from the source to drain terminals of a NMOS transistor 106. Positive ESD events between output pad 112 and Vss are handled by the clamp 404, while negative ESD events between output pad 112 and Vdd are handled by clamp 402. The ESD clamps 402/404 are not triggered on a specific voltage, such voltage triggering requires cumbersome trigger voltage selection circuitry. The ESD clamps 402/404 are triggered at a certain current level flowing through the transistors 104/106. When positive ESD stress between output pad 112 and Vss is applied, the NMOS transistor 106 conducts first because it forms the path with the lowest resistance. The invention adds a current detector in the current path through the transistor 106. When a current amplitude becomes significantly larger then the normal operation maximum current in that path, the ESD clamp 404 closes, creating a low ohmic shunt path between the output 112 and the Vss line, clamping the voltage and protecting the NMOS transistor 106. For negative ESD stress, between output pad 112 and Vdd the clamp 402 operates similarly to shunt the negative ESD stress to the Vdd line and protect the PMOS transistor 104. Diodes 302/304 can be added to shunt positive ESD stress between output pad 112 and Vdd and negative ESD stress between output pad 112 and Vss, respectively.

Figure 5:
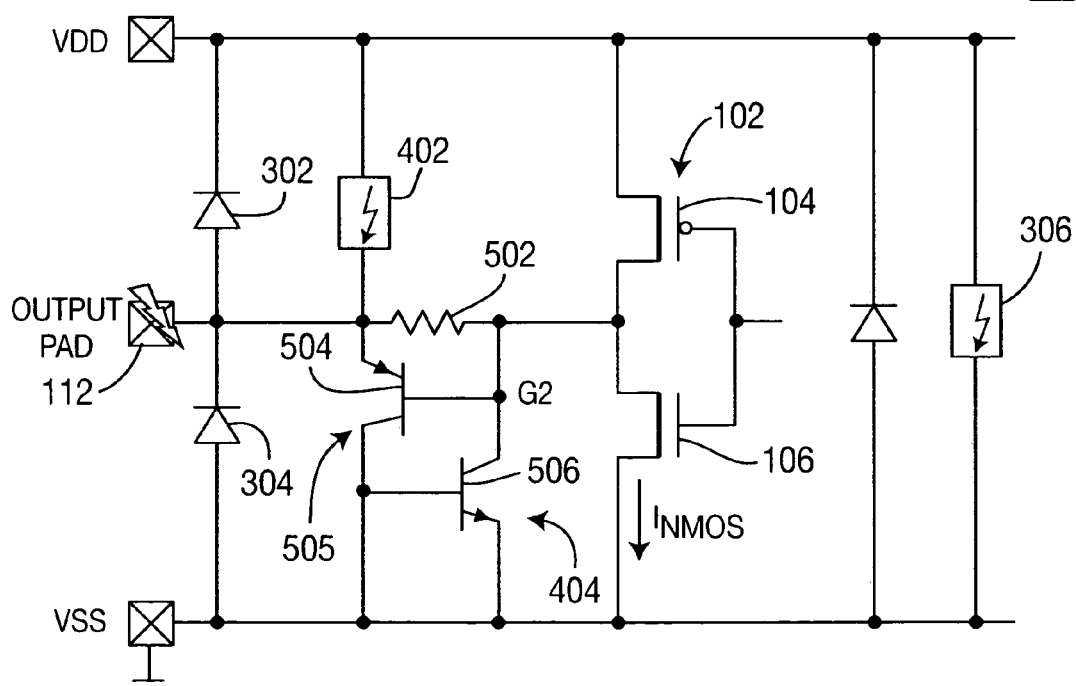
FIG. 5 depicts a schematic diagram of one implementation of the present invention using a current controlled SCR.

FIG. 5 depicts a schematic diagram of the first implementation of output driver 500, where the ESD clamp 404 comprises an SCR 505 and a current sensing resistor 502 that operates as a current detector. For simplicity, only the clamp 404, protecting the NMOS transistor 106, is shown and described in detail. An implementation for clamp 402, protecting the PMOS transistor 402, is shown and described with respect to FIG. 8. The current sensing resistor 502 (or other triggering or sensing element) may be shared to activate both ESD clamps 402,404.

The SCR 505 comprises a first transistor 504 and second transistor 506 that are arranged in a conventional manner. Specifically, the base and the emitter of transistor 506 are connected to the collector of transistor 504 and to Vss (the cathode), respectively. The collector of transistor 506 is connected to the base of transistor 504 and the output of the driver 102 (forms gate G2). The emitter of transistor 504 forms the anode of the SCR 505 and is connected to the output pad 112. The current sensing resistor 502 is connected between the gate G2 and the anode of the SCR 505. The ESD clamp 404 is triggered when the voltage drop between the anode (connected to the output node) and the G2 node (connected to the drain of the NMOS) reaches roughly 0.7V, i.e. the built in voltage of the Anode-G2 diode of the SCR 505. The value of the resistor 502 is defined in such a way that the voltage drop across the resistor 502 is below 0.7V for currents up to the maximum allowed current in normal operation. For ESD current levels, which are typically much larger, the voltage drop across resistor 502 is large enough to trigger the SCR 505.

To limit the current through driver 106, diode 302 can be placed behind resistor 502. In this case the current flowing through resistor 502 before triggering of the SCR 505 is divided between 2 current paths: driver 106 and diode 302.

Although in the previous description, the current sensing resistor 502 is placed over the Anode-G2 junction of SCR 505, i.e., at the drain side of output driver 106, the same principles apply when the resistor is placed over the G1-cathode resistor for SCR 505, i.e., at the source side of output driver 106.

The NMOS transistor 106 serves as a self-controlled trigger element for the ESD clamp 404. An SCR based ESD clamp is selected because it has the highest ESD current robustness per area.

The value of the current sensing resistor 502 that is placed between the anode and the G2 (Nwell) connection of the SCR 505 can be calculated based on the maximum current that flows through the NMOS transistor 106 during normal operation. A 100 um NMOS transistor 106 typically has a maximum of $I_{NMOS\_normal\_operation}=50$ mA of normal operation output current (0.5 mA/um gate width). When formed to be ESD robust, this NMOS can provide typically ten-times higher current level through its parasitic bipolar device: $I_{NMOS\_ESD}=500$ mA.

The resistor value needs to be small enough to prevent unwanted triggering of the SCR during normal operation, which can be formulated as:

$$I_{NMOS\_normal\_operation} \cdot R_{iso} \ll 0.4 \text{ V} \Rightarrow R_{iso} \ll \frac{0.4 \text{ V}}{50 \text{ mA}} = 8\Omega$$

On the other hand, the current sensing resistor value needs to be large enough to ensure that the ESD clamp 404 is triggered into a low ohmic state before the output driver 102 is damaged. The following computes the minimum value:

$$I_{NMOS\_ESD} \cdot R_{iso} \gg 0.7 \text{ V} \Rightarrow R_{iso} \gg \frac{0.7 \text{ V}}{500 \text{ mA}} = 1.4\Omega$$

In this example, the resistor value needs to be between 1.4 and 8 Ohm. In technologies where NMOS devices can be made robust, this equation delivers the same possibilities because the maximum parasitic bipolar current is typically ten times higher then the normal operation maximum current level.

Figure 9:
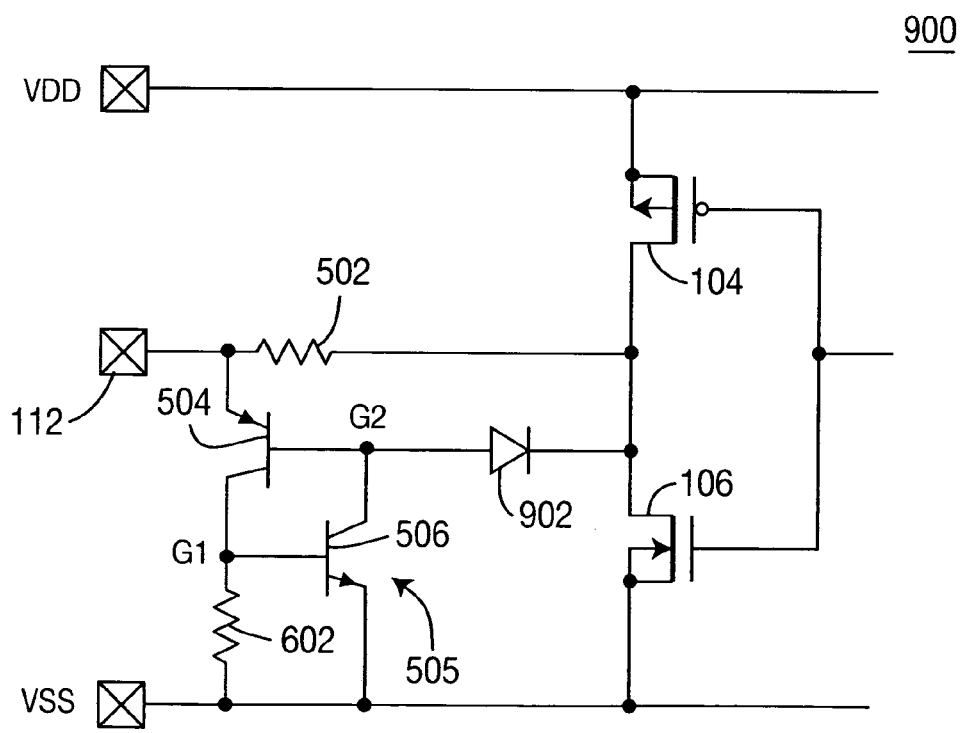
FIG. 9 depicts a schematic diagram of an alternative implementation of the present invention.

In an alternative implementation, shown in FIG. 9 as circuit 900, an impedance element 902 can be added between gate G2 and output driver (drain of transistor 106). The element 902 has a low impedance during an ESD event and a high impedance during normal circuit operation. An example of such an element 902 is a diode in forward conduction mode. This diode effectively lowers the capacitance seen by the output driver. The diode, however, increases the trigger current needed for the same sized current sensing resistor 502, since the total voltage across this resistor 502 needed to trigger the SCR 505, now equals 1.4 V, i.e., two times the intrinsic voltage drop of a diode. Using such an element 902 provides an additional voltage drop that provides additional margin with respect to an ESD event. This can be important in high temperature applications. Also, for drivers with high operating current, the resistor 502 may be very small and not practical. Consequently, adding a diode 902 enables a practical value of resistor 502 to be used.

Figure 12:
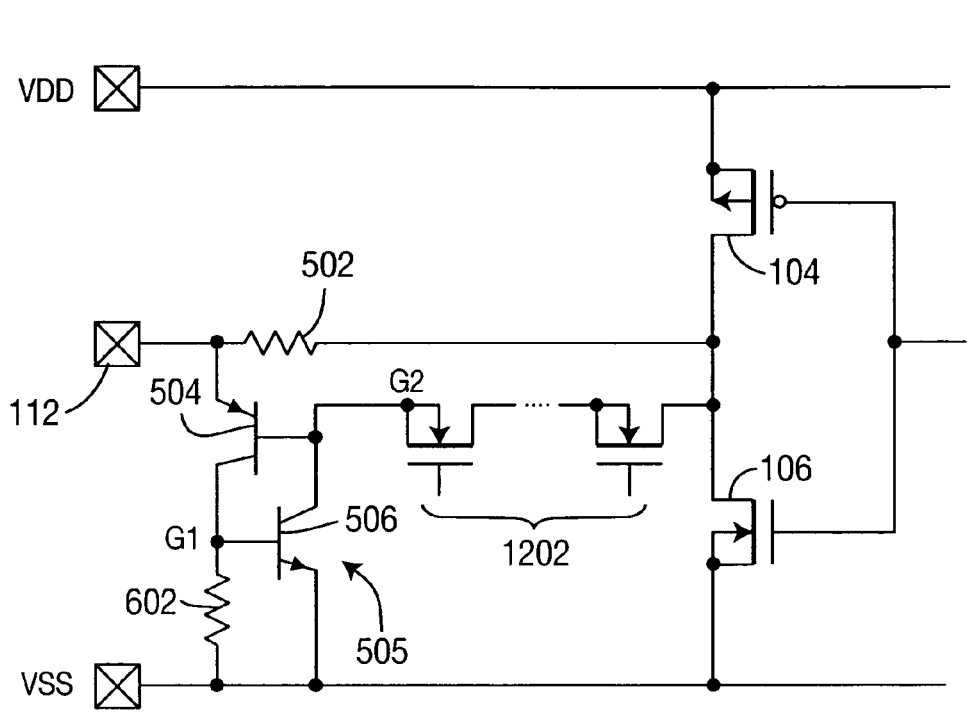
FIG. 12 depicts an alternative implementation for the embodiment of FIG. 9.
Figure 13:
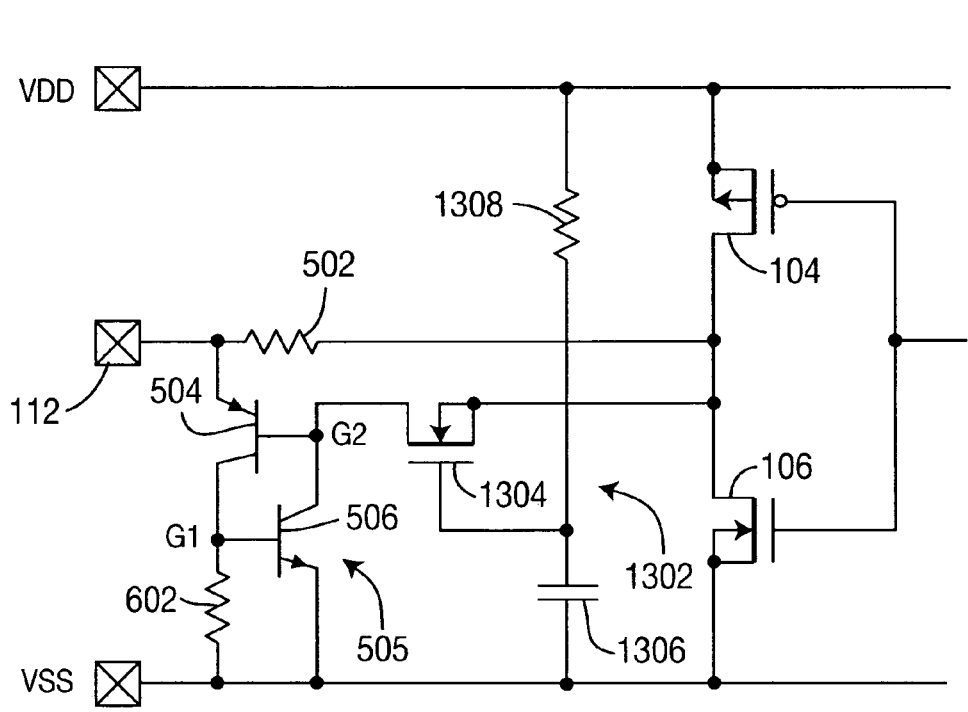
FIG. 13 depicts another alternative implementation for the embodiment of FIG. 9.

Other devices may be used as impedance element 902 including a plurality of series connected diodes, a MOS device and the like. FIG. 12 depicts a schematic of an alternative implementation of the embodiment in FIG. 9 comprising a circuit 1200 having the impedance element being a series of MOS devices 1202 coupled from node G2 to the inverter output. FIG. 13 depicts a further implementation of the embodiment of FIG. 9 comprising a circuit 1200, wherein an impedance element 1302 comprises a MOS transistor 1304, a capacitor 1306 and a resistor 1308. The drain of the transistor is coupled to the node G2 and the source is coupled to the inverter output. The resistor 1308 and capacitor 1306 are connected in series from VDD to VSS. Therefore, this circuitry switches transistor 1304 into an off state when the Vdd line is powered up. The gate of the transistor 1304 is coupled to VSS through the capacitor 1306. Furthermore, if the gate G1 is used to trigger the SCR 505, the element 902 is connected from the gate G1 to the drain of the transistor 106.

Figure 6:
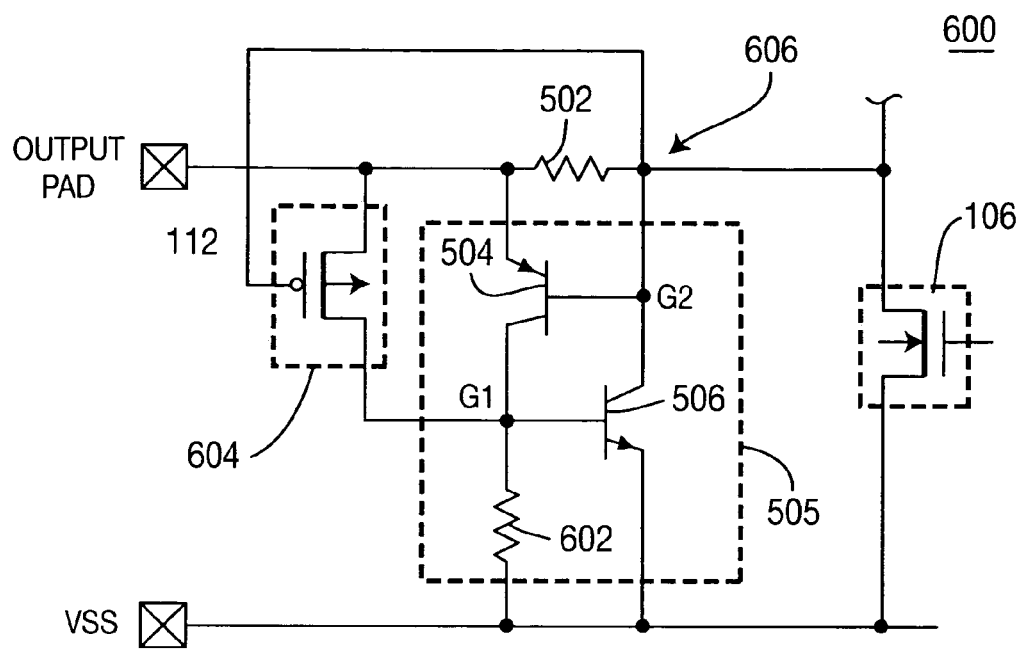
FIG. 6 depicts a schematic diagram of a second implementation of the present invention.

In another implementation of the invention, shown in FIG. 6, a PMOS transistor 604 is added to the ESD clamp 606 of driver 600, connecting PAD 112 to G1 of the SCR 505. The gate of the PMOS transistor 604 is connected to the output driver 106. The gate G2 of the SCR 505 can be either connected to the output driver 106, left floating, or coupled to the output pad 112. Each of these connections can be made through a dedicated R2 resistor 502 to lower the triggering current. A bias resistor 602 is connected from G1 to Vss. This resistor can either be externally added, or the intrinsic substrate or Pwell resistance inside the SCR 505. During an ESD event, the gate of the PMOS transistor 604 is pulled low, triggering the transistor in MOS mode. The PMOS transistor 604 then injects current into the G1 node of the SCR 505, effectively triggering the ESD clamp. Moreover, if gate G2 of SCR 505 is coupled to the output driver, then since the voltage across resistor 502 also forward biases the diode at node G2 of the SCR, the SCR can also be triggered by current flowing through the G2 node. The triggering condition thus becomes:

$$I_{NMOS\_ESD} \cdot R_{sense} >> \min(0.7V, Vth_{PMOS})$$

To keep the clamp off during normal operation, the condition is: $I_{NMOS\_normal\_operation} \cdot R_{sense} << \min(0.3V, V'_{PMOS})$, where V'PMOS is the source-gate voltage of the PMOS transistor 502, where the leakage through the PMOS transistor is sufficiently low. Since the MOS characteristics are typically known at the time of ESD protection development, the ESD-engineer is able to calculate the appropriate value for $R_{sense}$ 602. By including the PMOS transistor 604 in the design, the SCR trigger current is divided over two paths (the PMOS transistor 604 and the driver transistor 106), thus lowering the amount of current the driver transistor 106 needs to conduct before the SCR 505 is triggered.

Figure 7:
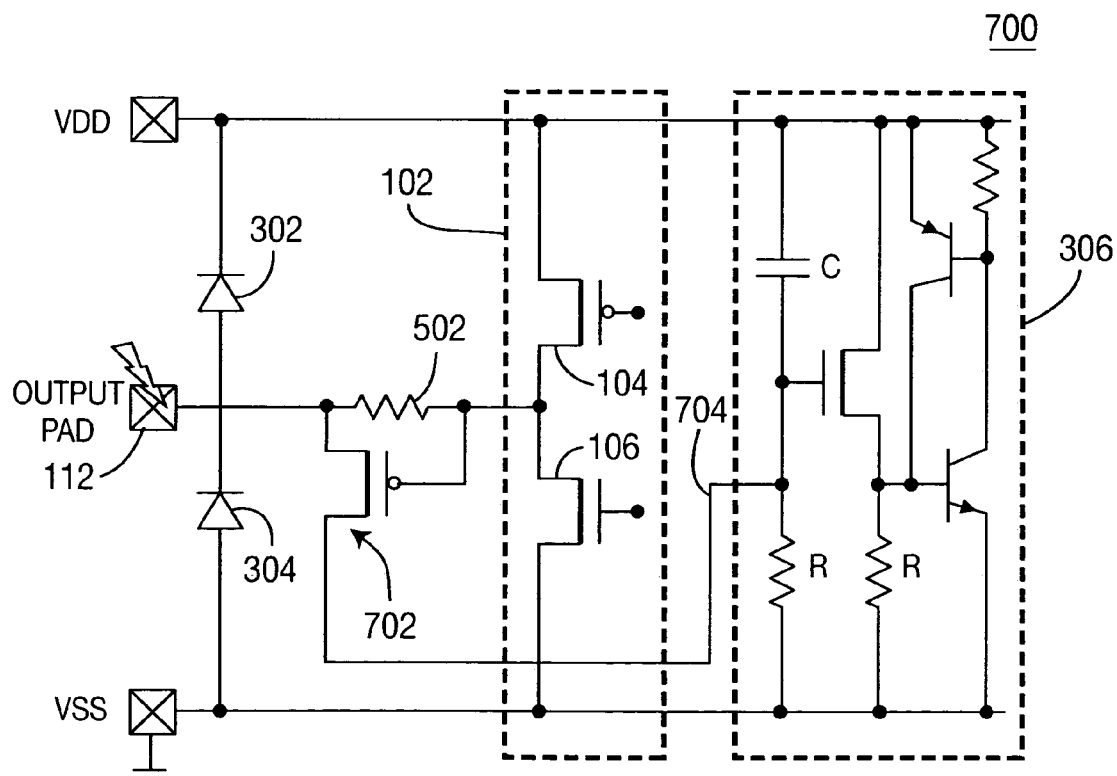
FIG. 7 depicts a schematic diagram of a third implementation of the present invention.

In another implementation of an output driver 700, shown in FIG. 7, a voltage drop across a PMOS gate-source of transistor 702 creates a bias signal that is fed over a shared trigger bus 704 to the power clamp 306. The PMOS transistor 702 is only a very small additional device that is added in each input-output pad 112. The additional trigger bus 704 is shared over all I/O's and can be of a small metal width because the current is limited to low values since R value (~1 kOhm) is high. ESD stress applied at the I/O pad 112 versus VSS is first flowing through the driver NMOS transistor 106 which turns on the PMOS transistor 702 starting from a certain current level (e.g., 100 mA) when enough gate-source bias is created. During normal operation, there is not enough of a voltage drop to activate the PMOS transistor 702. When a PMOS transistor 702 is turned-on, it will pull up the potential of the trigger bus 704 to the IO-pad voltage. This creates a signal to activate the power clamp 306 at a very low Vt1 thus enabling current flow through the diode 302 and the power clamp 306. As an example, the power clamp 306 is created as a well-known NMOS triggered SCR to create a high holding current SCR in order to prevent latch-up issues.

Figure 8:
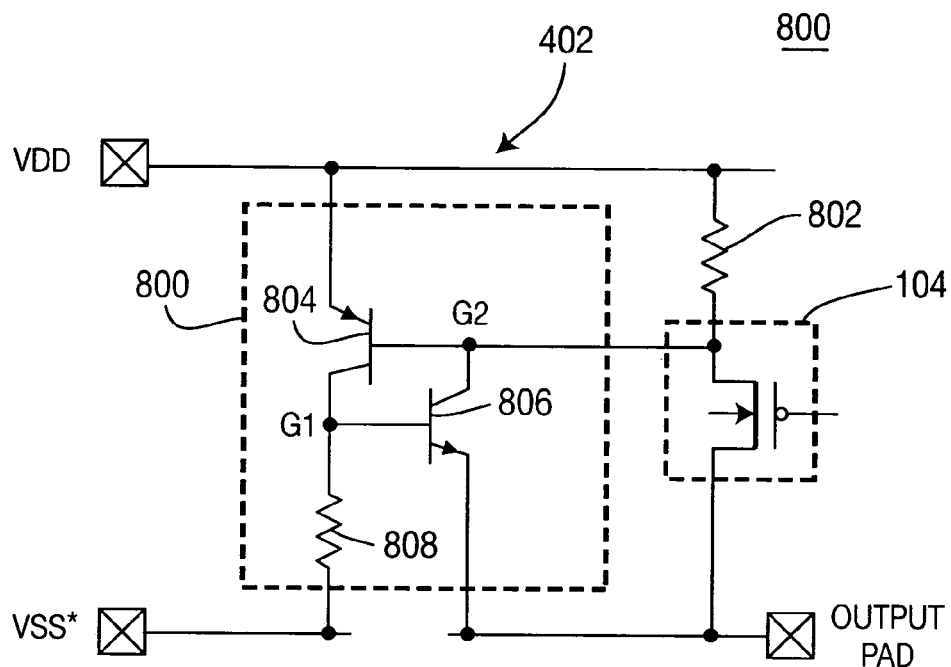
FIG. 8 depicts a schematic diagram of an implementation of the present invention for protecting a PMOS transistor of an output driver.

FIG. 8 depicts a schematic diagram of an implementation of a portion of an output driver 800 having an ESD clamp 402 and current sensing resistor 802 i.e., a (current detector to protect a PMOS transistor 104). The ESD clamp 402 comprises an SCR 800. The SCR 800 comprises a PNP transistor 804, an NPN transistor 806 and resistor 808. An emitter of transistor 804 is coupled to Vdd, the base of transistor 804 is connected to the source of driver transistor 104 and to the collector of transistor 806. The collector of transistor 804 is connected to the base of transistor 806 and to Vss through resistor 808. If the output driver circuit uses deep N-well technology or silicon on insulator technology, then the resistor 808 may be connected to the output terminal 112 rather than Vss, or, alternatively be left floating. The emitter of transistor 806 is connected to the output terminal 112. The resistor 802 is coupled between Vdd and the source of transistor 104. The voltage drop across resistor 802 is proportional to the current through transistor 104. As with the first embodiment, when the current through resistor 802 becomes a large value, then the SCR 800 is activated and conducts the ESD current from the output pad 112 to Vdd. The value of resistor 802 is computed in the same manner as discussed above. Additional triggering circuitry of FIGS. 6 and 7 can be used with the PMOS protection circuit 800 of FIG. 8. In some applications, the triggering circuitry may be used in either the PMOS protection circuitry, the NMOS protection circuitry, or both, i.e., the ESD circuits do not have to be symmetric.

Figure 10:
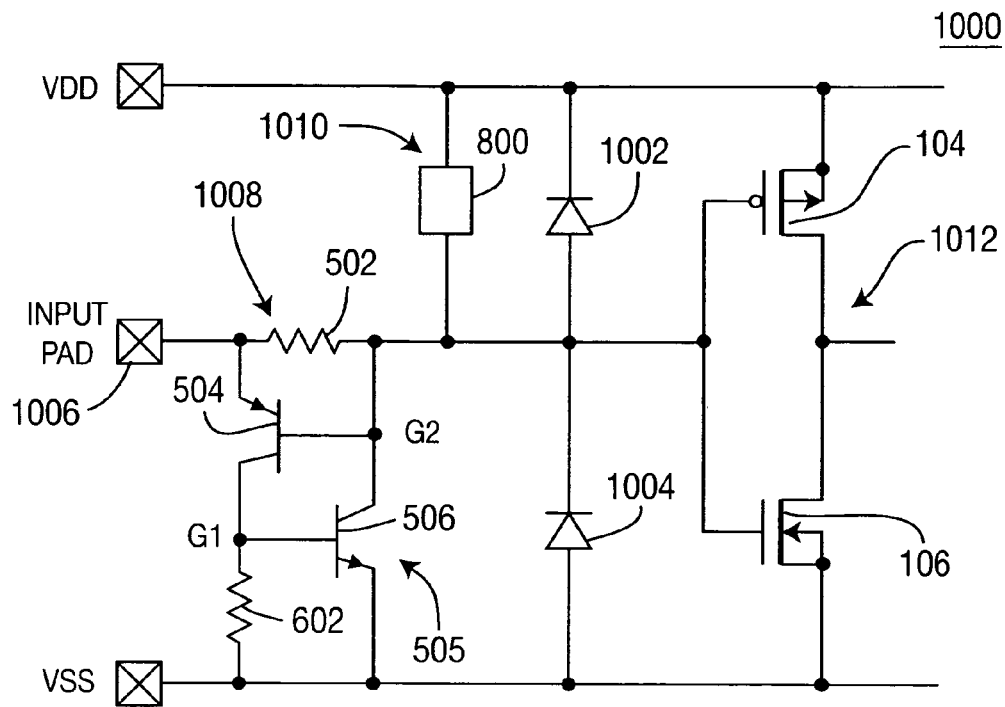
FIG. 10 depicts schematic diagram of an embodiment of the present invention for protecting an input pad of an integrated circuit.

FIG. 10 depicts an embodiment of the invention for use to protect a circuit 1012 coupled to an input pad 1006 using a current controlled ESD circuits 1008, 1010. To protect the circuit 1000 from a positive ESD event, the ESD circuit 1008 comprises an SCR 505 (bipolar transistors 504, 506 and resistor 602) being coupled to a current sensing resistor 502. To protect the circuit 1000 from a negative ESD event, the ESD circuit 1010 comprises an SCR structure similar to SCR 800 of FIG. 8.

The resistor 502 is coupled from an input pad to an input of a circuit 1012 to be protected (transistors 104 and 106). In one example of an input circuit 1012, the transistors, an NMOS transistor 106 and a PMOS transistor 104, have their gates coupled to each other. The source of the PMOS transistor 104 is coupled to a voltage Vdd and the source of the NMOS transistor 106 is coupled to a voltage Vss. The drains of each transistor 104,106 may be coupled together.

To provide a path for a triggering current to flow into the input pad without flowing through the transistor gates, a first diode 1002 is coupled from the gate to Vdd (anode at Vdd). and a second diode 1004 is coupled from the gate to Vss (cathode at Vss). In this manner, a positive ESD event current flows through the resistor 502 and diode 1002 to Vdd. When the ESD current is sufficiently large, the SCR 505 is triggered to conduct the ESD stress to Vss. A negative ESD event, current flows through resistor 502 diode 1004 to Vss. When the ESD current is sufficiently large, the SCR 800 is triggered to conduct the ESD stress to Vdd. Consequently, a current controlled ESD circuit is used to protect the input of the circuit 1012 from both positive and negative ESD stress.

Figure 11:
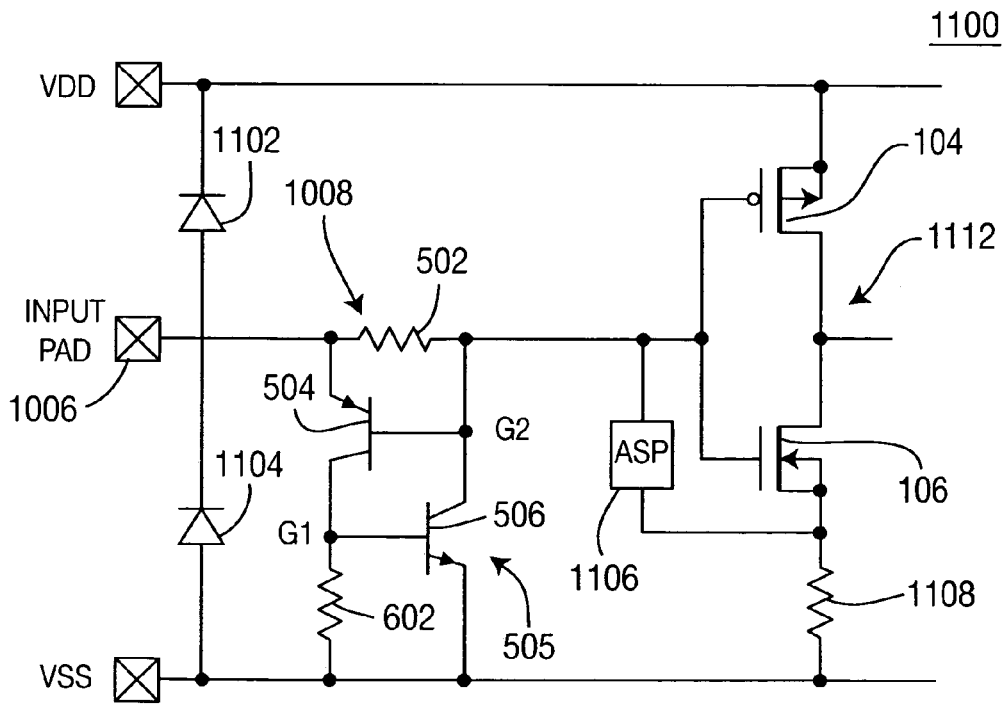
FIG. 11 depicts schematic diagram of an alternative implementation of the embodiment for protecting an input pad of an integrated circuit.

FIG. 11 depicts an alternative implementation of the embodiment of the invention in FIG. 10. In this implementation of an input circuit 1100, a diode 1102 is coupled from the input pad 1006 to Vdd (anode to Vdd) and a diode 1104 coupled from input pad 1006 to Vss (cathode to Vss). To protect the input from positive ESD stress, an SCR 505 is coupled from the input pad to Vss to conduct when triggered by the current sensing resistor 502. The current path during normal operation is through the active source pumping (ASP) circuit that is connected from the gate junction to the source of transistor 106. A resistor 1108 couples the source 106 to Vss. When excessive current flows through the series connected resistor 502, ASP 1106 and resistor 1108; then the SCR is triggered. A similar circuit configuration can be used to protect the circuit 1012 from negative ESD stress.

While the foregoing is directed to embodiments of the present invention, other and further embodiments of the invention may be devised without departing from the basic scope thereof, and the scope thereof is determined by the claims that follow.

The invention claimed is:

1. An electrostatic discharge (ESD) device comprising:
   a current detector for detecting current flowing through a circuit to be protected;
   a clamp, coupled to the current detector, that activates the protected circuit against an ESD event
   when the current detector detects a current having at least a predefined magnitude.

2. The ESD device of claim 1 wherein the current detector is a resistor having a value that defines the predefined magnitude of the current.

3. The ESD device of claim 1 wherein the circuit is a transistor in an output driver.

4. The ESD device of claim 1 wherein the circuit comprises at least one diode between output pad and a reference potential, where the at least one diode conducts at least part of the current flowing through the current detector.

5. The ESD device of claim 1 wherein the clamp is a silicon controlled rectifier (SCR).

6. The ESD device of claim 5 wherein an impedance element is coupled between SCR and the current detector.

7. The ESD device of claim 6 wherein the impedance element comprises at least one diode.

8. The ESD device of claim 6 wherein the impedance element comprises at least one MOS device.

9. The ESD device of claim 8 wherein the MOS device has a gate that is coupled to place the MOS device in high impedance mode during normal operation and in low impedance mode during the ESD event.

10. The ESD device of claim 9 where the gate of the MOS device is coupled to a resistor-capacitor circuit.

11. The ESD device of claim 1 wherein
a trigger circuit, coupled to the current detector, where the current detector activates the trigger circuit that activates the clamp.

12. The ESD device of claim 11 wherein the trigger circuit comprises a MOS transistor.

13. The ESD device of claim 1 wherein the ESD device comprises a power clamp coupled across the circuit to be protected from a first reference potential to a second reference potential.

14. The ESD device of claim 13 wherein the power clamp further comprises
an SCR; and
a first transistor, coupled between at least one of said reference potentials and at least one gate of said SCR, where a gate of the first transistor is coupled tote current detector.

15. The ESD device of claim 14 wherein said current detector comprises a resistor,
a second transistor, coupled to the resistor, where a gate of said second transistor is biased by current flowing in said resistor.

16. The ESD device of claim 14 wherein the gate of said first transistor is further coupled between said reference potentials.

17. The ESD device of claim 16 wherein coupling of said gate between said reference potentials through an resistor-capacitor circuit.

18. The ESD device of claim 14 wherein the first transistor is coupled to said SCR through at least one inverter stage.

19. The ESD device of claim 13 wherein the clamp further comprises
an SCR; and
a first transistor, coupled between the first reference potential and a gate of said SCR and where a gate of the first transistor is coupled to the current detector.

20. The ESD device of claim 13 wherein the clamp further comprises:
at least one transistor, coupled between said reference potentials; and
a biasing circuit to control a gate of said first transistor in normal operation conditions, where the gate is coupled to the current detector.

21. The ESD device of claim 20, wherein said biasing circuit comprises an resistor-capacitor circuit.

22. The ESD device of claim 13 wherein the current detector is coupled to the clamp via a bus.

23. The ESD circuit for protecting an output circuit comprising;
a first current detector connected in a current path from an output pad to a first potential through a first protected transistor;
a first SCR having a gate connected to the current detector, an anode connected to the output pad and a cathode to the first potential; said first SCR activates to protect the output circuit against an ESD event when the first current detector detects a current having at least a predefined magnitude;
a second current detector connected in a current path from the output pad to a second potential through a second protected transistor; and
a second SCR having a gate connected to the current detector, a cathode connected to the output pad and an anode connected to the second potential; said second SCR activates to protect the output circuit against an ESD event when the first current detector detects a current having at least a predefined magnitude.

24. The ESD circuit of claim 23 wherein the first and second current detectors are resistors.

25. The ESD circuit of claim 23 further comprising a first trigger device coupled to the current detector and the first SCR and a second trigger device coupled to the current detector and the second SCR.

* * * * *

UNITED STATES PATENT AND TRADEMARK OFFICE
CERTIFICATE OF CORRECTION

| | | |
|---|---|---|
| PATENT NO. | : 7,110,230 B2 | Page 1 of 1 |
| APPLICATION NO. | : 11/147668 | |
| DATED | : September 19, 2005 | |
| INVENTOR(S) | : Van Camp et al. | |

It is certified that error appears in the above-identified patent and that said Letters Patent is hereby corrected as shown below:

Title page, item (73) Assignee: After "(US)", insert --and Sarnoff Europe BVBA, Gistel, Belgium (BE)--.

Signed and Sealed this

Thirteenth Day of March, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,110,230 B2 | Page 1 of 1 |
| APPLICATION NO. | : 11/147668 | |
| DATED | : September 19, 2006 | |
| INVENTOR(S) | : Van Camp et al. | |

It is certified that error appears in the above-identified patent and that said Letters Patent is hereby corrected as shown below:

Title page, item (73) Assignee: After "(US)", insert --and Sarnoff Europe BVBA, Gistel, Belgium (BE)--.

This certificate supersedes Certificate of Correction issued March 13, 2007.

Signed and Sealed this

Tenth Day of April, 2007

JON W. DUDAS
*Director of the United States Patent and Trademark Office*